US010128292B2

(12) United States Patent
Stark

(10) Patent No.: US 10,128,292 B2
(45) Date of Patent: Nov. 13, 2018

(54) CHARGE STORAGE CELL AND METHOD OF MANUFACTURING A CHARGE STORAGE CELL

(71) Applicant: STMicroelectronics (Research & Development) Limited, Buckinghamshire (GB)

(72) Inventor: Laurence Stark, Edinburgh (GB)

(73) Assignee: STMICROELECTRONICS (RESEARCH & DEVELOPMENT) LIMITED, Buckinghamshire (GB)

(*) Notice: Subject to any disclaimer, the term of this patent is extended or adjusted under 35 U.S.C. 154(b) by 0 days.

(21) Appl. No.: 15/637,616

(22) Filed: Jun. 29, 2017

(65) Prior Publication Data
US 2018/0166496 A1    Jun. 14, 2018

(30) Foreign Application Priority Data

Dec. 13, 2016  (EP) .................................... 16203798

(51) Int. Cl.
*H01L 21/76*    (2006.01)
*H01L 21/762*   (2006.01)
*H01L 27/146*   (2006.01)

(52) U.S. Cl.
CPC .... *H01L 27/1463* (2013.01); *H01L 21/76224* (2013.01); *H01L 21/76237* (2013.01); *H01L 27/14687* (2013.01)

(58) Field of Classification Search
CPC ........ H01L 21/76224; H01L 21/76237; H01L 27/1463; H01L 27/14683; H01L 27/14687
See application file for complete search history.

(56) References Cited

U.S. PATENT DOCUMENTS

| 6,090,661 A * | 7/2000 | Perng ................ H01L 21/76237 257/301 |
| 6,177,699 B1 | 1/2001 | Perng et al. |
| 8,531,567 B2 | 9/2013 | Roy et al. |
| 9,521,304 B2 | 12/2016 | Hirigoyen et al. |
| 2008/0102557 A1 | 5/2008 | Kim et al. |
| 2012/0122261 A1 | 5/2012 | Adkisson et al. |
| 2016/0307948 A1 | 10/2016 | Stark |

FOREIGN PATENT DOCUMENTS

EP    3082165 A1    10/2016

* cited by examiner

*Primary Examiner* — Robert Bachner
*Assistant Examiner* — Molly Reida
(74) *Attorney, Agent, or Firm* — Slater Matsil, LLP

(57) ABSTRACT

A method can be used to manufacture a charge storage cell with a first trench and a second trench in a substrate material. The first trench is filled with a doped material. The second trench is filled with a second trench material. The method includes causing the dopant to diffuse from the first trench to thereby provide a doped region adjacent to the first trench. The material from the first and second trenches is removed and at least one of the trenches is filled with a capacitive deep trench isolation material to provide capacitive deep trench isolation.

30 Claims, 14 Drawing Sheets

Vertical cross section along dashed line V-V'

Horizontal cross section along line H-H'

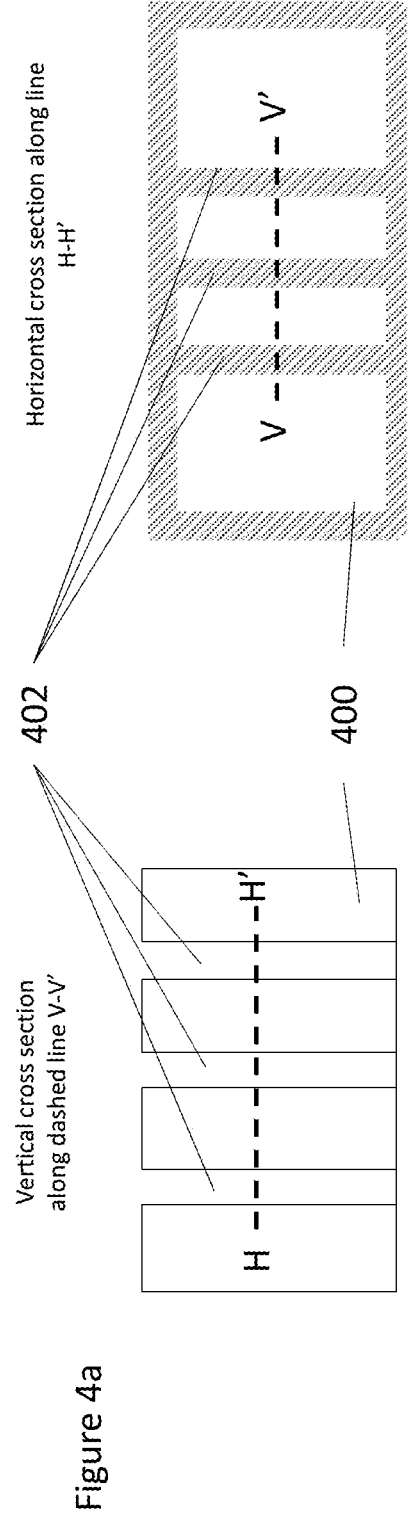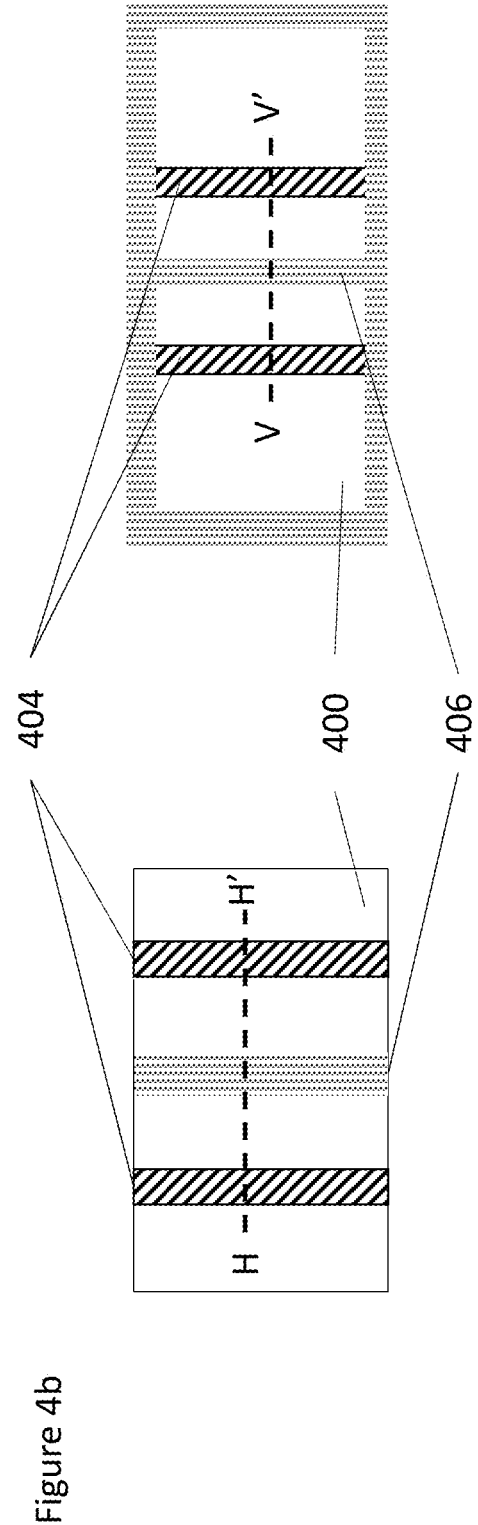

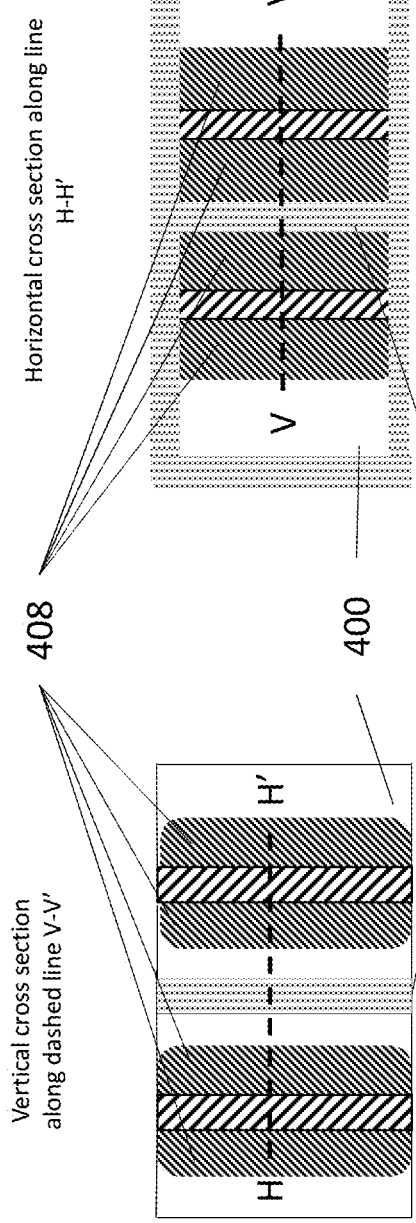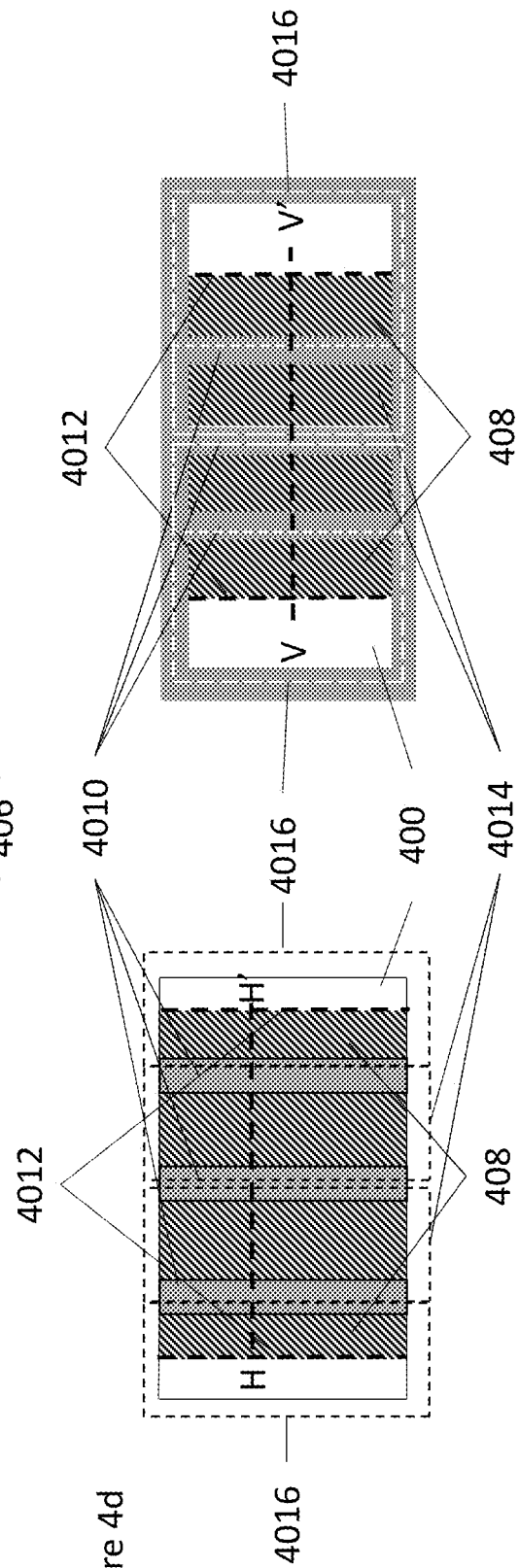
Figure 4c
Figure 4d

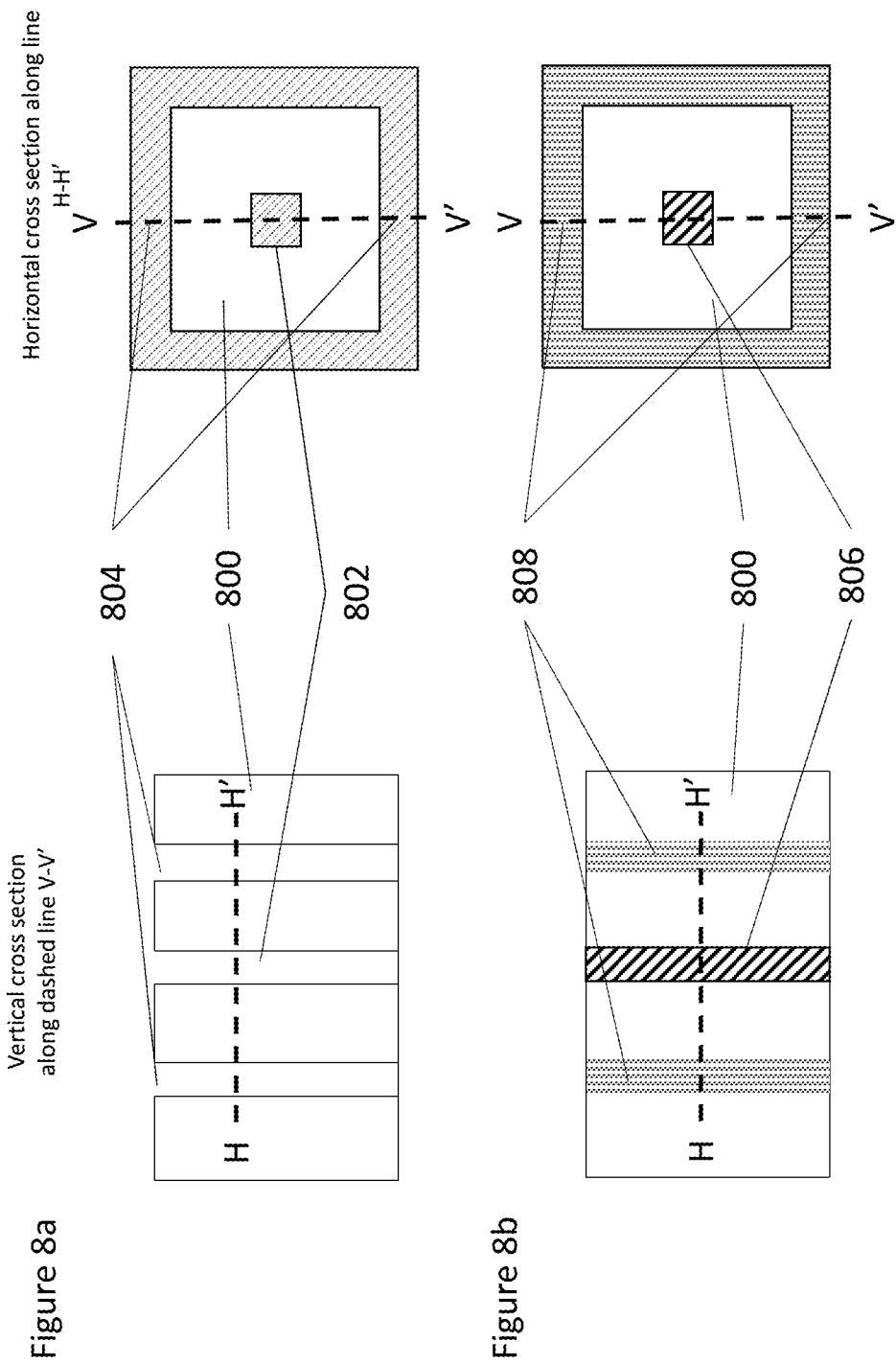

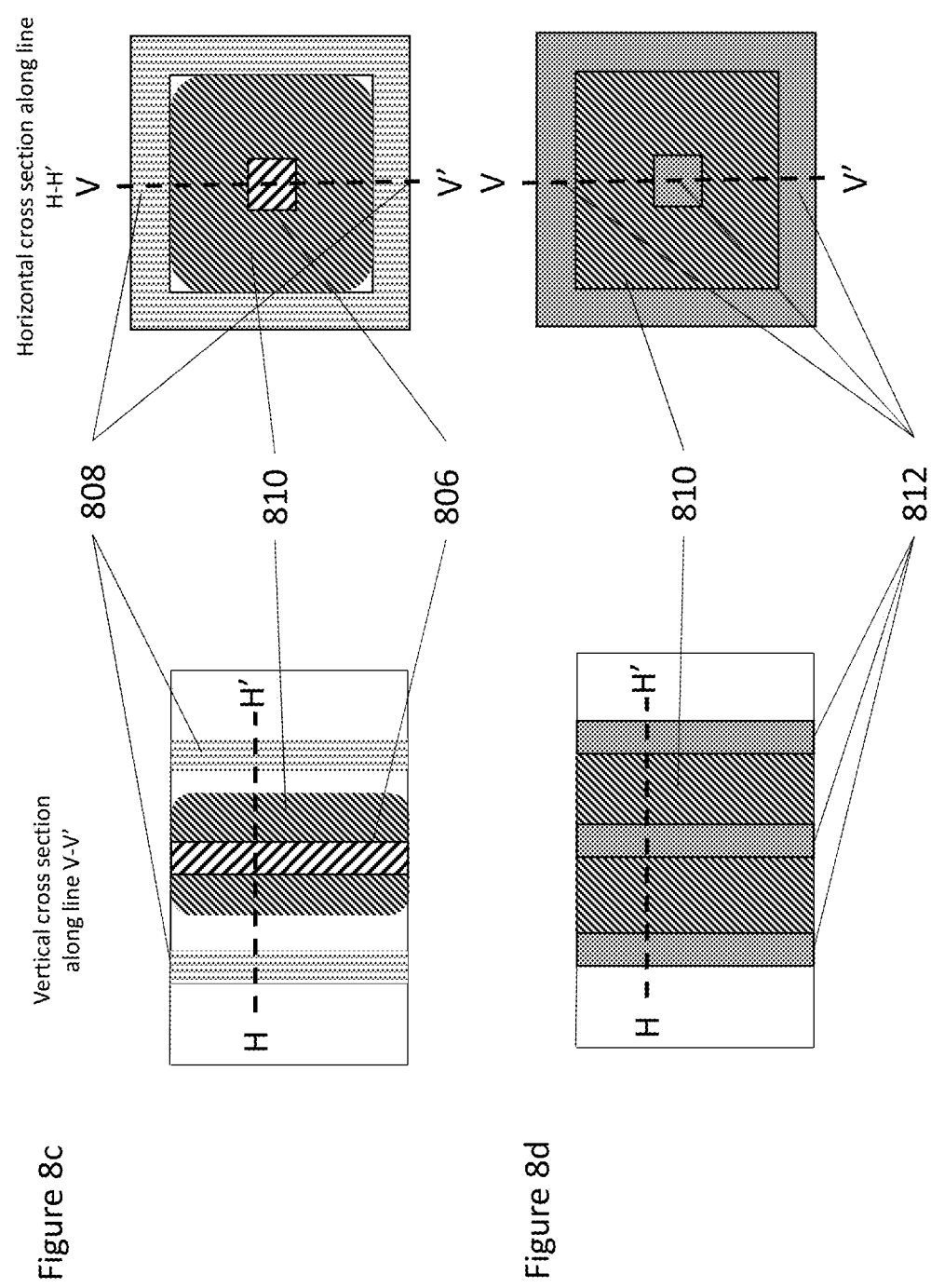

CHARGE STORAGE CELL AND METHOD OF MANUFACTURING A CHARGE STORAGE CELL

CROSS-REFERENCE TO RELATED APPLICATIONS

This application claims priority to European Patent Application No. 16203798.0, filed on Dec. 13, 2016, which application is hereby incorporated herein by reference.

TECHNICAL FIELD

This disclosure relates to a method for manufacturing a charge storage cell, charge storage cell and a pixel array having respective charge storage cells.

BACKGROUND

Image sensors using photodiode pixels are known. Such image sensors have many applications. In some applications, an array of pixels may be provided. In a global shutter arrangement of a camera, all pixels are simultaneously released from reset and start to integrate simultaneously during photographic exposure. After a specific period, all the pixels are then read out simultaneously into a temporary storage, which may be located inside the pixel. This temporary storage may be then scanned out row by row where the signal is amplified or converted into a digital value.

SUMMARY

According to an aspect, a method of manufacturing a charge storage cell, the method comprises providing a first trench and a second trench in a substrate material. The first trench is filled with a doped material comprising one of a P dopant and an N dopant and the second trench is filled with a second trench material. The one dopant is diffused from the first trench to thereby provide a doped region adjacent the first trench. The material is removed from the first and second trenches and at least one of the trenches is filled with a capacitive deep trench isolation material to provide capacitive deep trench isolation.

The doped region may provide a charge storage region in the charge storage cell.

The doped region may have a depth which is at least equal to the depth of the first trench.

The doped region may be provided between the first trench and the second trench.

The second trench material may be an undoped material.

The method may further comprise providing further doping of the doped region with the one dopant to form a region of higher dopant concentration in the doped region.

The providing further doping may comprise using ion implantation to provide the further doping.

The first trench and the second trench may be provided by etching.

The doped material may comprise doped silicon oxide or polysilicon and the second trench material may comprise silicon oxide or polysilicon.

The causing of the dopant to diffuse may comprise performing annealing.

The removing of the material from the first and second trenches may be performed by etching to remove the material from the first and second trenches.

The method may comprise providing a third trench on the side of the first trench opposite to the second trench and filling the third trench with the undoped material. The one dopant diffuses from the first trench to thereby provide a first doped region between the first trench and the second trench and a second doped region between the first trench and the third trench. The first doped region provides a charge storage region for a first charge storage cell and the second doped region provides a charge storage region for a second charge storage cell.

The method may comprise a third trench on the side of the second trench opposite to the first trench, filling the third trench with the doped material. The one dopant diffuses from the first trench and the third trench to thereby provide a first doped region between the first trench and the second trench and a second doped region between the second trench and the third trench. The first doped region provides a charge storage region for a first charge storage cell and the second doped region provides a charge storage region for a second charge storage cell.

The diffusion of the dopant may cause a further doped region to be provided, the further doped region providing a PN junction.

At least one of the first and second trenches may be configured to surround at least partially the other of the first and second trenches.

The trench which surrounds at least partially the other of the first and second trenches may comprise one or more gaps to permit charge transfer to and from the charge storage cell The doped material may be an N doped material.

The substrate material may comprise a dopant, the dopant being the other of the P dopant and the N dopant.

According to another aspect, there is provided a charge storage cell manufactured according to any of the previously described methods.

According to another aspect, a charge storage cell is provided in a semiconductor substrate having charge carriers of a first conductivity type. The charge storage cell comprises a first deep trench isolation structure and a charge storage region located adjacent to the first deep trench isolation structure. The charge storage region comprises charge carriers of a second conductivity type different to the first conductivity type. A second deep trench isolation structure is located adjacent to the charge storage region and opposite the first deep trench isolation structure.

A second charge storage region may be provided.

A third deep trench isolation structure may be provided.

The second charge storage region may be located adjacent to the second deep trench isolation structure and opposite to the first charge storage region.

The third deep trench isolation structure may be located adjacent to the second charge storage region and opposite to the second deep trench isolation structure.

A photodiode may be provided adjacent to the first deep trench structure and opposite to the charge storage region.

A photodiode may be provided adjacent to the first and third deep trench isolation structures, and opposite to the first and second charge storage regions.

A first transfer gate, a second transfer gate, and a sense nodes may be provided. The input of the first transfer gate is coupled to one of the photodiodes, and the output of the first transfer gate is coupled to the charge storage region. The input of the second transfer gates is connected to the charge storage region, and the output of the second transfer gate is connected to a sense node.

The charge storage region may comprise a region of higher dopant concentration relative to the remainder of the charge storage region.

The deep trench isolation structure may comprise polysilicon.

An array of pixels having charge storage cells such as described above may be provided.

The array may be arranged such that a deep trench isolation structure may be shared by a pair of adjacent pixels.

BRIEF DESCRIPTION OF THE DRAWINGS

For a better understanding of some embodiments, reference is made by way of example only to the accompanying Figures in which:

FIGS. 4a to 4e show horizontal and vertical cross sections for a further charge storage cell, during various stages of its manufacture;

FIGS. 8a to 8d show horizontal and vertical cross sections for a further charge storage cell, during various stages of its manufacture.

DETAILED DESCRIPTION OF ILLUSTRATIVE EMBODIMENTS

Some embodiments may be used with charge-domain pixels. This may be in the context of a global shutter arrangement of a camera or other image capture device. For this type of pixel, the most common circuit is the '6T' (6 transistor) architecture and its derivatives. This will be described in more detail with reference to FIG. 7 below. With this pixel, the signal charge is transferred from the photodiode to a storage diode at the end of integration. Upon readout, the signal charge is then transferred from the storage diode to the sense node and read out.

It should be appreciated that whilst some embodiments are described in the context of a 6T arrangement, other embodiments may be used with different numbers of transistors.

Figure 7:
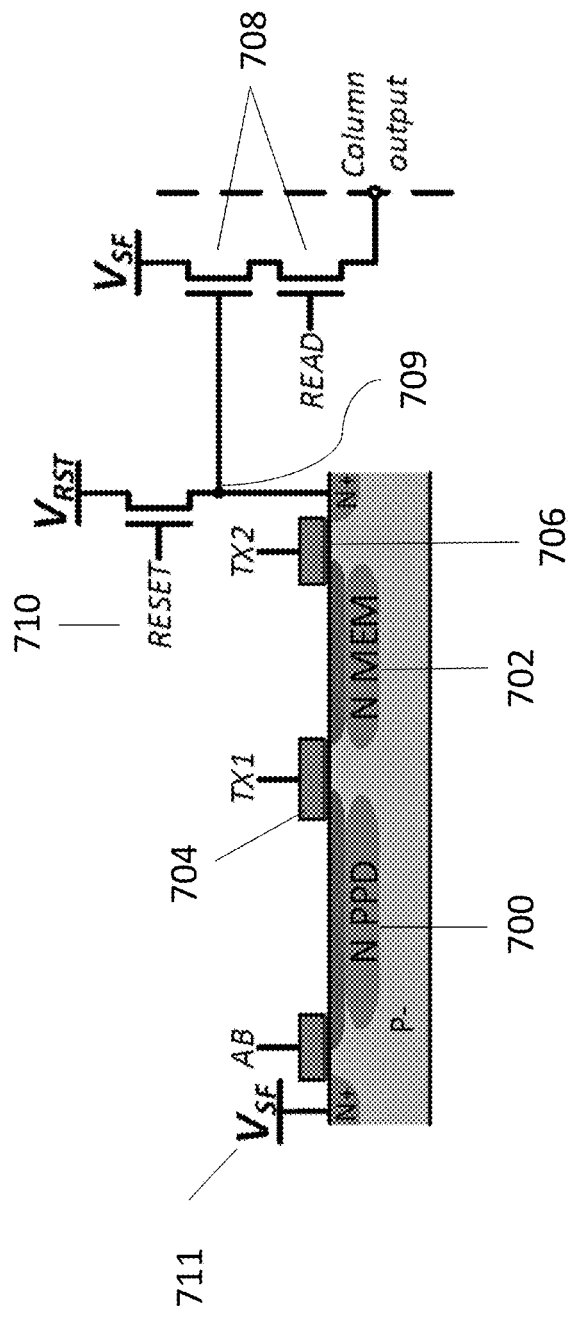
FIG. 7 shows a so called 6T (6 transistor) pixel structure.

Reference is made to FIG. 7 which schematically shows a 6T pixel arrangement, comprising a photodiode 700 and charge storage region 702. The photodiode 700 generates signal electrons when photons impinge on the photodiode. After an integration time period, the signal electrons are transferred to the charge storage region 702 by a first transfer gate transistor 704. The first transfer gate transistor 704 is controlled by a first transfer gate signal TX1. The drain of the first transfer gate is coupled to the charge storage region 702, and the source is coupled to the photodiode 700. The charge within the charge storage region is then transferred to a sense node 709 to be read during a readout process through a second transfer gate transistor 706. The second transfer gate 706 is controlled by second transfer gate signal TX2. The drain of the second transfer gate is coupled to the sense node 709, while the source is connected to the charge storage region 702. A pair of transistors 708 control the reading out of charge from the sense node. Once readout is complete, the pixel is reset through a reset transistor 710. On the other side of the photodiode 700 to the first transfer gate is a source follower transistor 711.

These pixels may comprise vertical storage photodiodes. These global shutter sensors may be charge-domain global shutter sensors.

Figure 1:
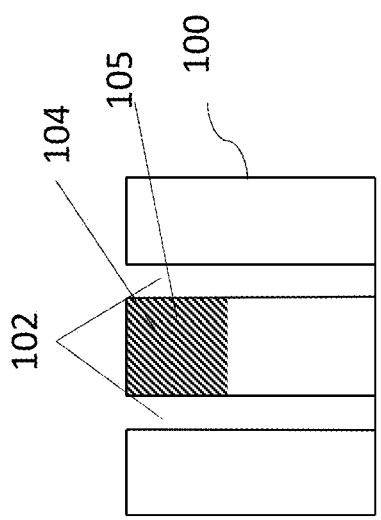
FIG. 1 shows a vertical storage photodiode.

A vertical storage photodiode may have an N-well formed within a P-type substrate. An example of such a photodiode is shown schematically in FIG. 1, where CDTI (Capacitive Deep Trench Isolation) etches 102 are carried out in a P-type substrate 100. Within the region formed by the DTI is an N-type doped region 104. Doping is typically achieved using ion implantation, where dopant ions are accelerated to high velocity and directed onto the surface of the semiconductor substrate. When the ions impinge on the surface, they undergo a series of collisions with the substrate atoms before coming to rest within the substrate. The depth to which the dopant ions penetrate into the substrate is proportional to the energy of the incident ions. The shaded region 105 shows the charge storage region, the depth of which is controlled by the ion penetration.

Vertical storage photodiodes offer good charge storage area density owing to their minimal footprint in the X and Y dimensions. However, currently pixels are limited by the charge storage region 105, which is in turn limited by the depth of the charge storage implant. To achieve a greater dopant penetration depth, and thus a greater charge storage volume, using ion implantation, a higher incident ion energy is required. However high-energy ion implantation is correlated with increased lattice defects and interstitials. These can manifest in undesirable characteristics of the sensor, such as increased dark current and current leakage due to the defect states created. Further the photoresist layer necessary for ion implantation at such high energies may be too thick to allow for reliable ion implantation of a small area to be carried out.

As such, current manufacturing techniques may limit the charge storage potential of vertical storage photodiodes. This is shown schematically in FIG. 1 in that the charge storage region is provided in an upper region of the volume defined by the DTI and the lower region of the volume is not used for charge storage. This may in turn limit the global shutter imaging devices. In particular, the storage capacity of the charge storage cell and photodiode should be balanced. The pixel may be limited by the storage of the memory mode; that is the vertical storage diode.

Some embodiments may utilize trench diffusion to form the charge storage cell structure, avoiding the need for high energy ion implantation. This may allow a diode structure which scales with epitaxial layer depth to be provided.

In this document, reference is made to vertical cross sections and horizontal cross sections. It should be appreciated that the terms are used for convenience and do not imply any orientation of the product in use. The "vertical" cross section refers to a cross section which is along a plane which is perpendicular to the surface of the pixel on which the light, infra-red, near infra-red radiation or the like impinges. The "horizontal" cross section refers to a cross section which is along a plane which is parallel to the surface of the pixel on which the light, infra-red, near infra-red radiation impinges. It should be appreciated that in other embodiments, the cross sections shown in one or more of the figures may be along planes which have different orientations to the surface of the pixel, as compared to the following examples.

FIGS. 2a-e schematically represent the manufacturing process for a deep trench-diffused global shutter charge storage of an embodiment, showing a horizontal cross-section along the line H-H' of a vertical cross section and the vertical cross-section along the line V-V' of the horizontal cross section as indicated in the Figures.

Figure 2A:
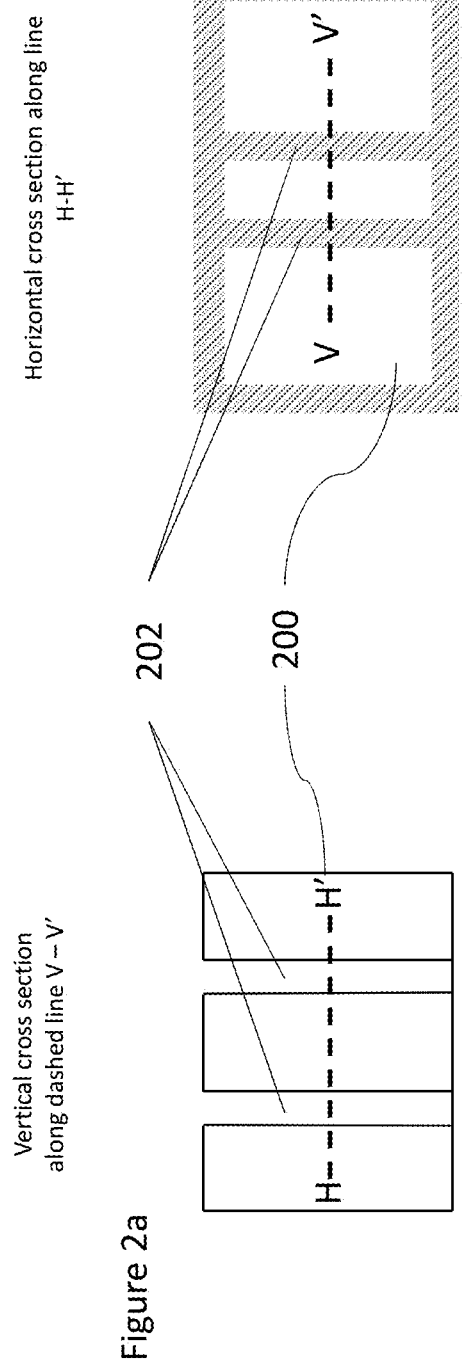
FIGS. 2a to 2e show horizontal and vertical cross sections for a first charge storage cell arrangement, during various stages of its manufacture.

Reference is first made to FIG. 2a. In FIG. 2a, a P type substrate 200 has two Deep Trench Isolation (DTI) line etch regions 202. In practice the DTI may be part of a ring like structure and may be circular, rectangular or square where a cross-section is taken perpendicular to the surface, as shown in FIG. 2a. In the example shown in FIG. 2, the ring like structure is rectangular in the horizontal cross-section In some embodiments, the substrate may be silicon. In other embodiments, the substrate can be any other suitable semiconductor. The width of a DTI etch may be of the order of 150-300 nm. The two DTI regions may be spaced apart by a distance of the order of 200-500 nm, while the depth of the etch may be to a depth of around 3 to 10 µm; however, it should be appreciate that the required dimensions will depend on one or more factors such as the application required. For example, the width should be wide enough such that the charge storage is relatively high, but low enough that the depletion potential of the diode is still relatively low.

Figure 2B:
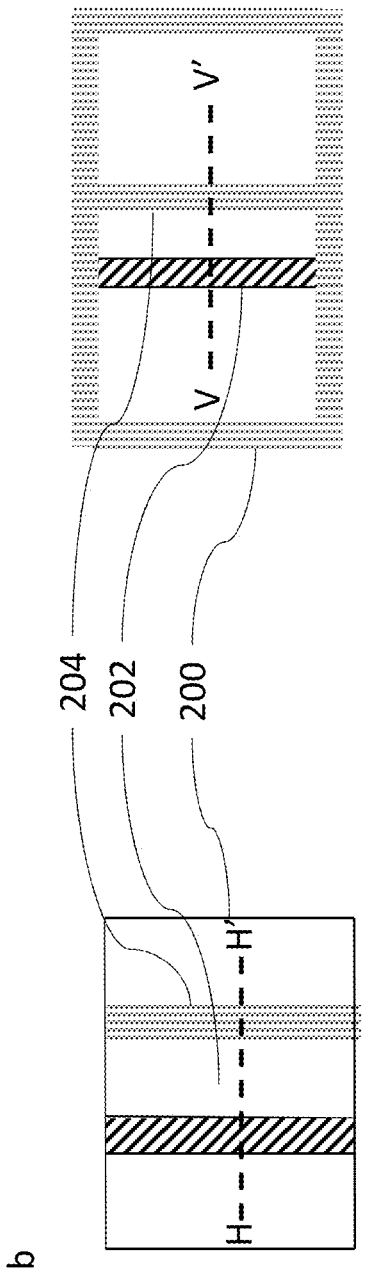

Following DTI formation, FIG. 2b shows the DTI trenches being filled with N-doped silicon oxide 202 and undoped silicon oxide 204 respectively. The N dopant may be any suitable material and may, for example, be a phosphorous, antimony or arsenic in the case of a silicon substrate. In some embodiments, the DTI trenches may be filled with doped polysilicon instead of doped silicon oxide. The material may be deposited by a CVD method.

Figure 2C:
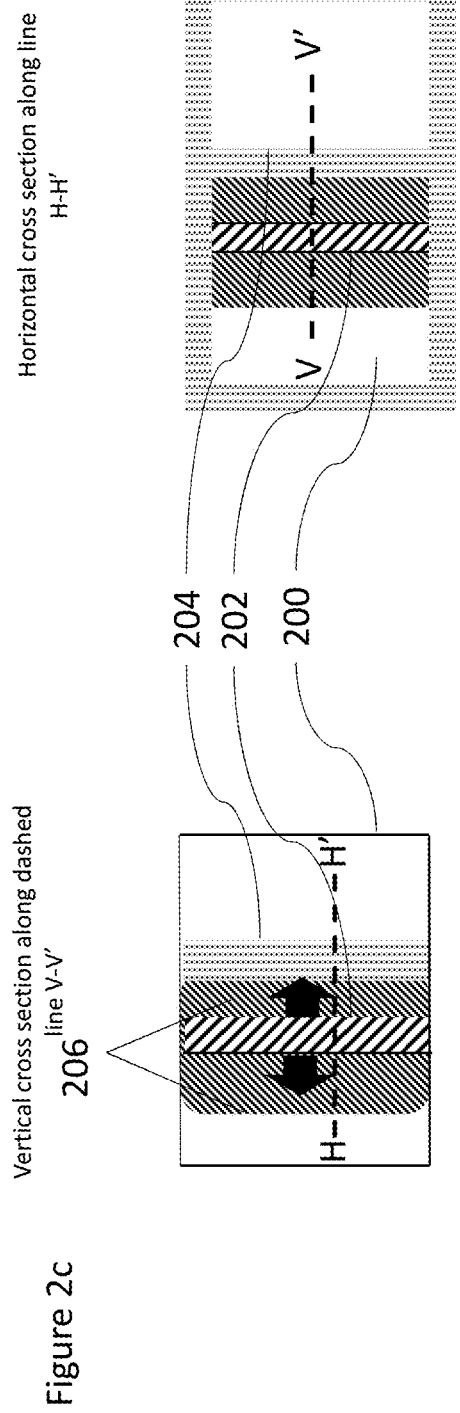

After the DTIs have been filled, the structure is annealed, as is shown in FIG. 2c. The temperature used will be dependent on the materials used, but may be in the 850-1050° C. range. The duration of annealing may be dependent upon the dimensions of the pixel. During annealing, the N-type dopant diffuses out of the trench and into the surrounding substrate to provide an N-doped area 206 in the substrate on either side of the trench which had the N-doped silicon oxide. Diffusion of the dopant may occur at a rate of ~0.3 µm per hour. The number of hours of annealing may then be defined by 0.3*d where "d" is the distance between the two trenches in µm. It should be appreciated that the most appropriate anneal time may be determined based on the particular materials and dimensions.

Once the annealing is complete, the doped and undoped silicon oxide trenches are again etched to remove the fillings, and a capacitive deep trench isolation (CDTI) filling applied to the trenches 2014. In some embodiments the CDTI filling may comprise polysilicon.

Figure 2D:
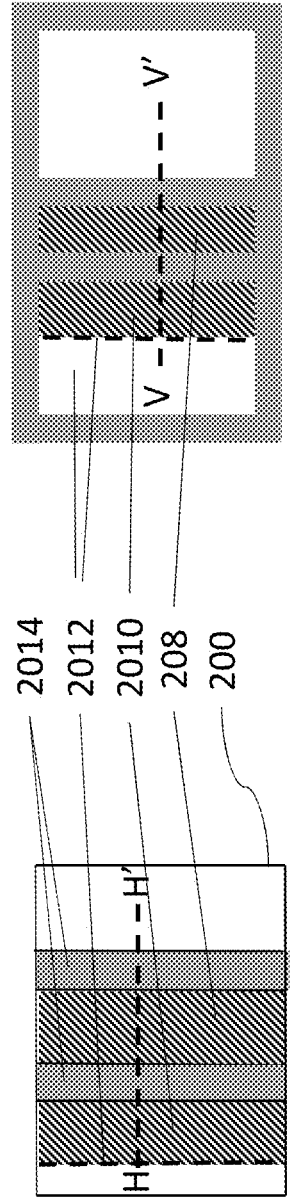

This results in a P-type substrate 200 interfaced with an N-type region 2010 along the depth of the cell 2012 and a charge storage cell or memory cell 208, both entirely along the depth of the CDTI 2014, as shown schematically in FIG. 2d. The interface between the P-type substrate 200 and diffused N-type dopant 2010 creates a PN junction 2012, which may be used to create a photodiode.

Figure 2E:
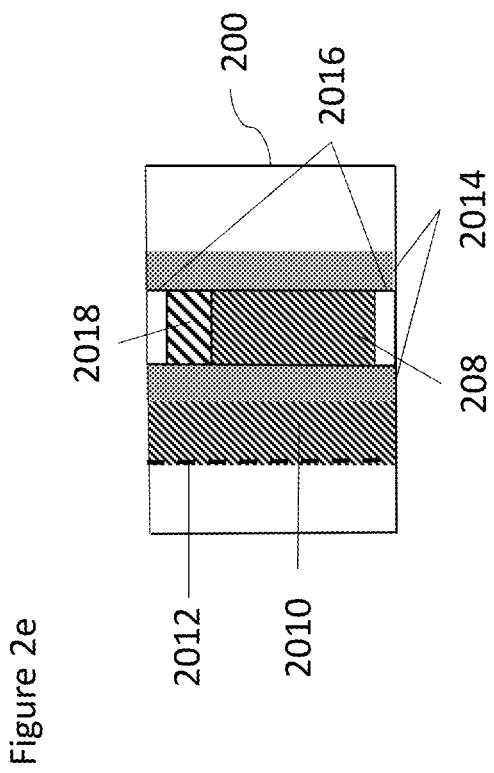

As shown in FIG. 2e, which only shows the vertical cross-section, P+ regions 2016 are provided above and/or below the N region between the CDTIs for the charge storage cell, with respect to the orientation of the Figure. The P+ regions are provided on one or other of the regions of the N-well not adjacent the trench regions.

FIG. 2e also schematically shows an optional subsequent ion implantation technique performed to shift the potential maxima upwards to permit easier charge transfer and for interface pinning. In this technique, the part of the N well closer to the surface where impinging light or other radiation is received may be further N doped to provide a region 2018 within the charge storage cell with a higher concentration of N dopant. The concentration of N type dopants in this region may be of the order of 2 to 5 times higher than the concentration of N type dopants within the remainder of the charge storage region.

In another embodiment, back-to-back charge storage cells may be created for adjacent pixels, as shown schematically in FIGS. 3a-d, which show a horizontal cross-sections along the lines H-H' of the vertical cross section and vertical cross-sections along the line V-V' of the horizontal cross-sections as indicated in FIGS. 3a to d.

Figure 3A:
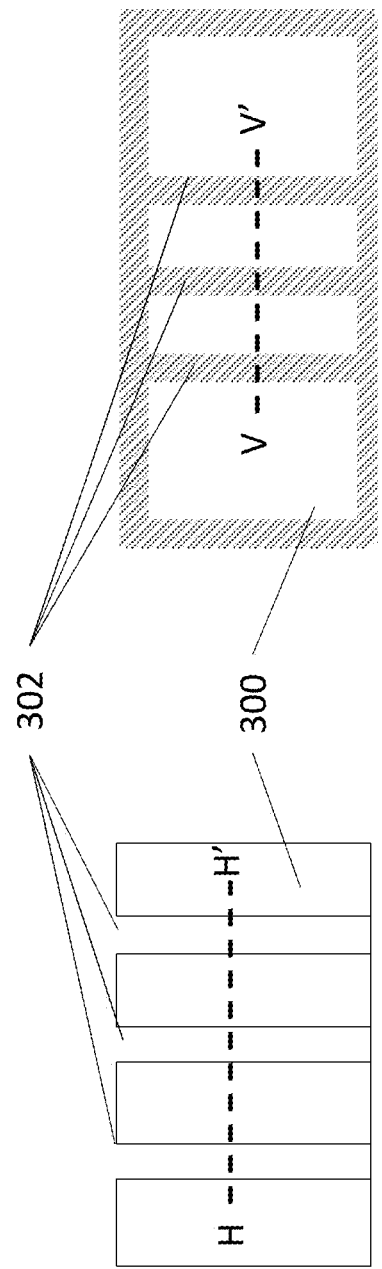
FIGS. 3a to 3d show horizontal and vertical cross sections for a second charge storage cell arrangement, during various stages of its manufacture.

Reference is made to FIG. 3a. Here, 3 DTI linear etches 302 are made into a P type substrate 300. In some embodiments, the substrate may be silicon. In other embodiments, the substrate can be any other suitable semiconductor. The width of the DTI etches may be of the order of 150-300 nm. The two areas may be spaced apart by a distance of the order of 200 nm to 5 µm, while the depth of the etch may be to a depth of around 3 to 10 µm; however, it should be appreciate that the required dimensions will depend on one or more factors such as the application required.

Figure 3B:
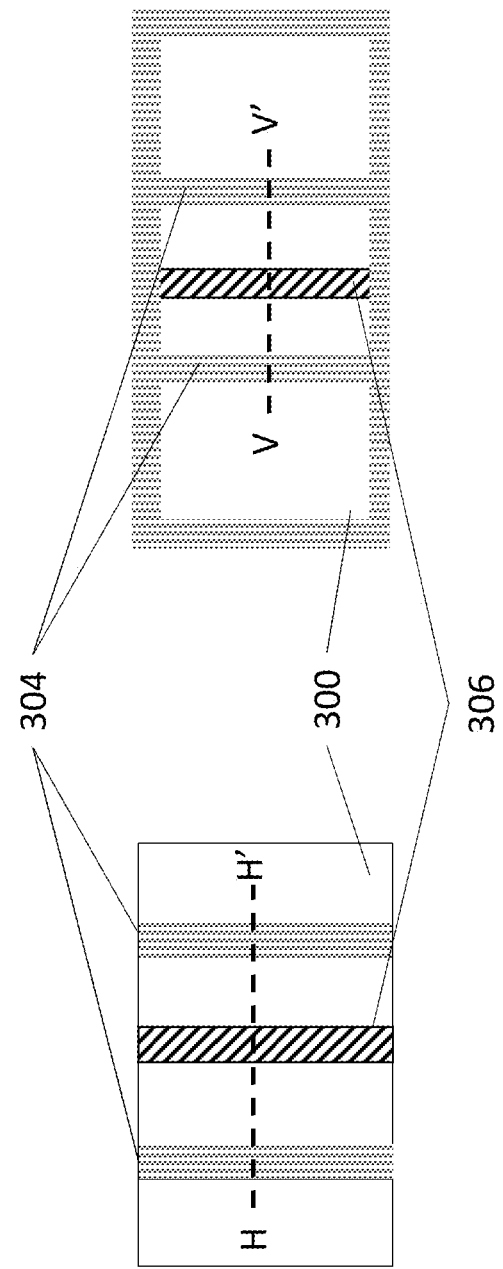

Following DTI formation, FIG. 3b shows the central trench being filled with an N-doped silicon oxide 306, and the adjacent trenches are filled with an undoped silicon oxide 304. The N dopant may be any suitable material and may, for example, be a phosphorous, antimony or arsenic in the case of a silicon substrate.

Figure 3C:
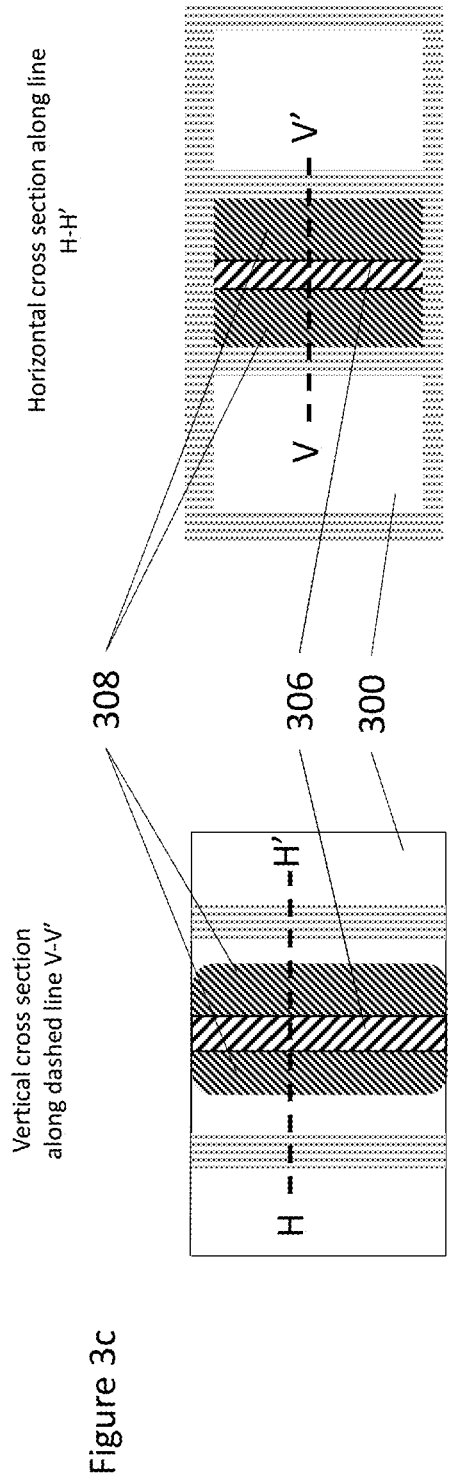
Figure 3D:
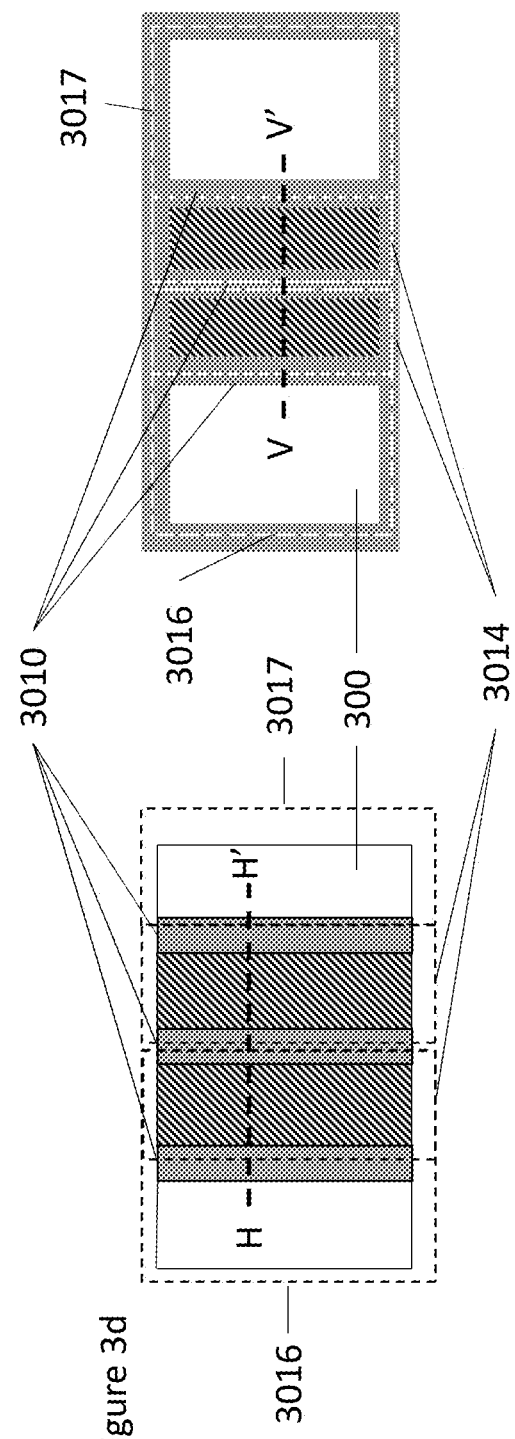

After the DTIs have been filled, the structure is annealed, as is shown in FIG. 3c. The temperature used will be dependent on the materials used, but may be in the 850-1050° C. range. The duration of annealing may be dependent upon the dimensions of the pixel. During annealing, the N-type dopant diffuses out of the central trench 306 and into regions of the surrounding substrate 308. Diffusion of the dopant may occur at a rate of ~0.3 µm per hour. The number of hours of annealing may then be defined by 0.3*d where "d" is the distance between the trenches in µm. It should be appreciated that the most appropriate anneal time may be determined based on the particular materials and dimensions.

Once annealing is complete, the doped and undoped oxide trenches are again etched to remove the fillings, and a capacitive deep trench isolation (CDTI) filling applied to the trenches 3010. In some embodiments the CDTI filling may comprise polysilicon. This results in two adjacent, symmetrical charge storage cells 3014 for adjacent pixels 3016 and 3017, both charge storage cells extending along the depth of the CDTI 3010, as shown schematically in FIG. 3d. P+ regions are provided, as described in relation to FIG. 2e to complete the charge storage cell. It should be appreciated that the higher concentration N dopant region may be provided in each cell, again as discussed in relation to FIG. 2e.

In another embodiment, the central doped linear style trench 306 of FIG. 3b may be replaced by a pillar like central trench surrounded by a ring like trench, as depicted schematically in FIGS. 8a-d, which show a horizontal cross-section and a vertical cross-section along the line V-V' as indicated in the Figures.

FIG. 8a shows the central pillar etch 802 and surrounding ring etch 804 performed into a P type substrate 800. In some embodiments the substrate may be silicon. In other embodiments the substrate may be any other suitable semiconductor.

Following etching, FIG. 8b shows the central pillar region is filled with an N doped oxide 806, and the surrounding ring region being filled with an undoped oxide 808. The N dopant may be any suitable material and may, for example, be a phosphorous, antimony or arsenic in the case of a silicon substrate.

After the central pillar etch and surrounding ring etch have been filled, the substrate is annealed, as shown in FIG. 8c. The temperature used will be dependent on the materials used, but may be in the 850-1050° C. range. The duration of annealing may be dependent upon the dimensions of the pixel. During annealing, the N-type dopant diffuses out of the central pillar region 806 and into regions of the surrounding substrate 810. The duration of annealing may be determined based on the particular materials and dimensions.

After annealing, the filling of the central pillar 806 and surrounding ring structure 808 may be removed by etching. Following the removal of the N-doped oxide from the central pillar region and the undoped oxide from the surrounding ring region, the central pillar region and surrounding ring region may be filled with a CDTI filling 812. In some embodiments the CDTI filling may comprise polysilicon. This may result in a charge storage cell comprising a charge storage region 810, isolated from the surrounding substrate by a ring like CDTI region 812, as shown in FIG. 8d. This particular embodiment of the charge storage cell may provide a smaller aspect ratio than straight-line style embodiments previously presented in FIG. 3d, but may require a smaller volume of doped oxide material, and may be formed without CDTI sharing between adjacent charge storage cells.

Figure 6:
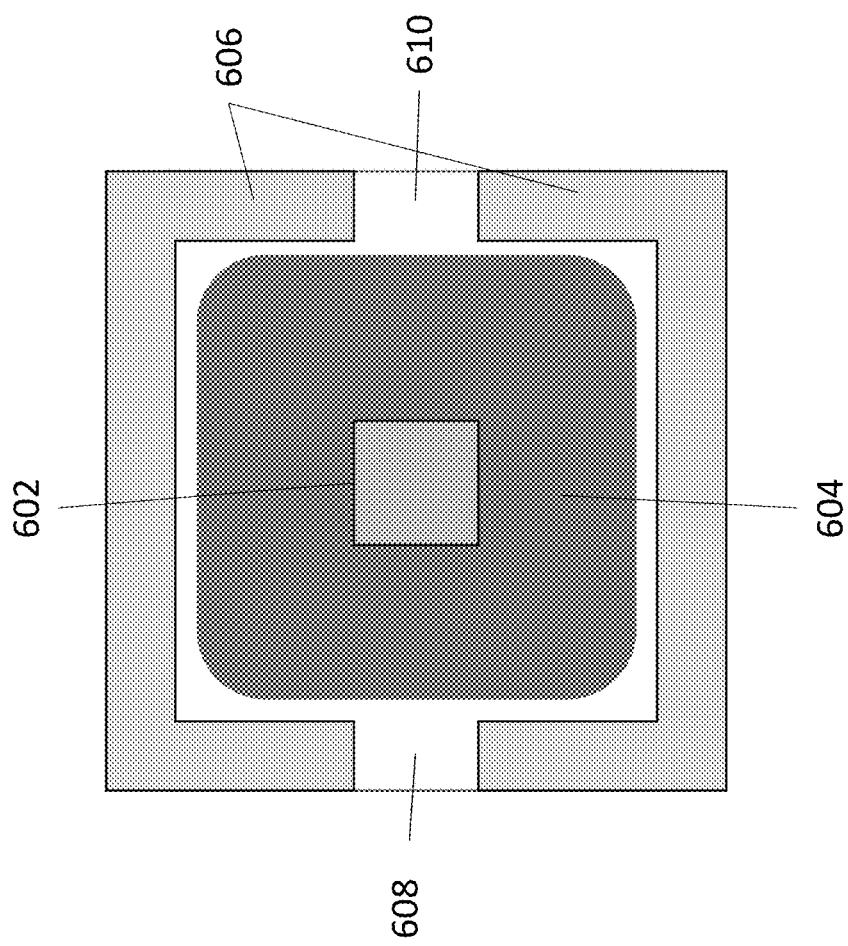
FIG. 6 shows a horizontal cross section for a further charge storage arrangement.

The CDTI ring structure may be formed with gaps on either side of the central CDTI pillar for further device elements to be added. For example, FIG. 6 shows schematically an embodiment where two gaps 608 and 610 are provided; the gap at 608 may allow for charge transfer from an adjacent photodiode via a first transfer gate and the gap at 610 may allow for charge transfer from the charge storage cell to a sense node via a second transfer gate.

In a further embodiment, the back-to-back charge storage cells for adjacent pixels may be formed while simultaneously creating photodetectors adjacent to the charge storage cells, as shown schematically in FIGS. 4a-d, which show a horizontal cross-sections along the lines H-H' of the vertical cross section and vertical cross-sections along the line V-V' of the horizontal cross-sections as indicated in FIGS. 4a-d.

Reference is firstly made to FIG. 4a. Here, 3 DTI etches 402 are made simultaneously into a P type substrate 400. In some embodiments, the substrate may be silicon. In other embodiments, the substrate can be any other suitable semiconductor. The width of the DTI etches may be of the order of 150-300 nm. The two areas may be spaced apart by a distance of the order of 200 nm to 5 μm, while the depth of the etch may be to a depth of around 3 to 10 μm; however, it should be appreciate that the required dimensions will depend on one or more factors such as the application required.

Following DTI formation, FIG. 4b shows the central trench being filled with an undoped silicon oxide 404, and the adjacent trenches are filled with an N doped silicon oxide 406. The N dopant may be any suitable material and may, for example, be a phosphorous, antimony or arsenic in the case of a silicon substrate.

After the DTIs have been filled, the structure is annealed, as is shown in FIG. 4c. The temperature used will be dependent on the materials used, but may be in the 850-1050° C. range. The duration of annealing may be dependent upon the dimensions of the pixel. During annealing, the N-type dopant diffuses out of both of the trenches and into regions of the surrounding substrate 408. Diffusion of the dopant may occur at a rate of ~0.3 μm per hour. The number of hours of annealing may then be defined by 0.3*d where "d" is the distance between the trenches in μm. It should be appreciated that the most appropriate anneal time may be determined based on the particular materials and dimensions.

Once annealing is complete, the doped and undoped silicon oxide trenches are again etched to remove the fillings, and a capacitive deep trench isolation (CDTI) filling applied to the trenches 4010. In some embodiments the CDTI filling may comprise polysilicon. This results in a P-type substrate 400 interfaced with an N-type region 408 along the depth of the cell, creating a full depth PN junction 4012 and two adjacent, symmetrical charge storage cells 4014, both entirely along the depth of the CDTI 4010, as shown schematically in FIG. 4d. In some embodiments, the full depth PN junctions may be used to create photodiodes 4016; resulting in two adjacent light detecting pixels with full depth charge storage cells.

Figure 4E:
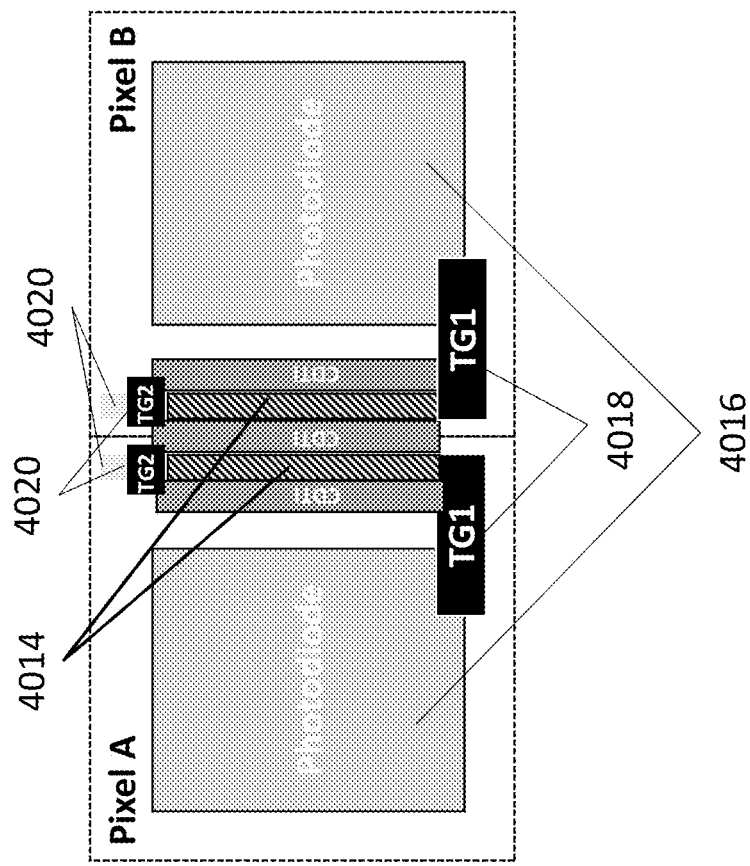

After the structure of FIG. 4d is created as described above, additional elements may be added to provide the desired functionality. This is shown in FIG. 4e, which shows a schematic plan view of an example device. For example, in one embodiment, first and second transfer gates 4018 and 4020 respectively may be added. A pair of first transfer gates 4018 allows charge transfer between the photodiodes 4016 and the charge storage cells 4014 respectively, and a pair of second transfer gates 4020 subsequently allows charge transfer between the charge storage cells 4014 and sense node 4022 to allow the charge stored in the charge storage cells 4014 to be read by the sensor. As can be seen the first and second transfer gates can be provided on opposite sides of the device.

Figure 5:
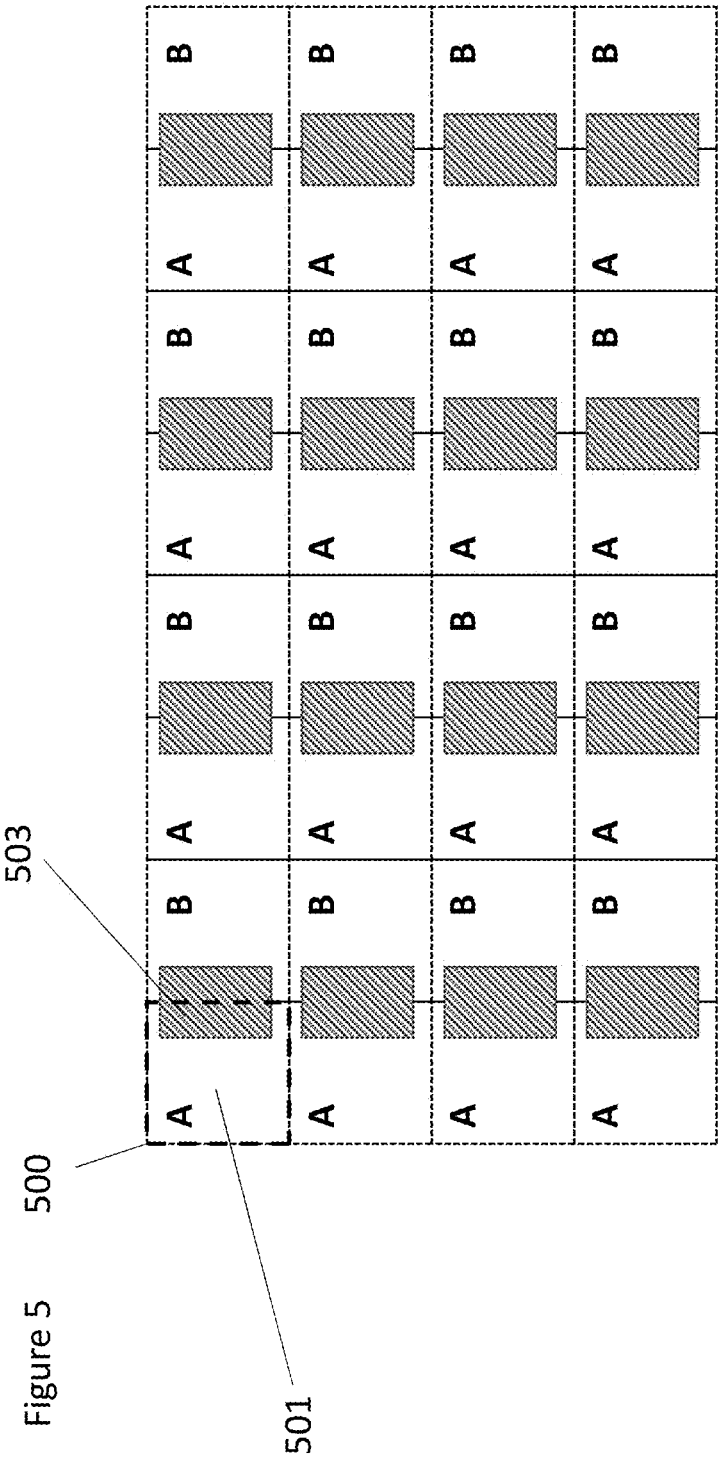
FIG. 5 schematically shows an array of pixels.

In some embodiments, the adjacent pixels containing back-to-back charge storage nodes may be tiled by repeating the processes described previously to create an array of any number of rows and columns. An example of this is shown schematically in FIG. 5, which is shown from a view perpendicular to the surface of the sensor array, for the case of adjacent pixels A and B, comprising a PN junction, which may be used as a photodiode, and charge storage cell; however it should be understood that this structure is exemplary only, and that any of the preceding structures may be tiled in such a manner. Various MOS devices are not shown in FIG. 5 for simplicity.

Each pixel 500 may comprise a photodiode 501 and a charge storage cell 503 as described previously. The photodiode 501 and charge storage cell 503 are separated from neighboring photodiodes and charge storage cells by a CDTI as previously discussed. It should be appreciated that there may be any number of pixels extending in the array, and that the relative dimensions of the photodiode and charge storage cell are not accurately represented in FIG. 5.

In another embodiment, instead of using a P-type substrate and an N-type doped oxide trench, an N-type substrate and P-type doped trench may be used.

The doped regions are formed adjacent to the CDTI regions. This means that the need for a guard region may be avoided. In some cases the guard ring may be of the order of 3 μm. Some embodiments therefore allow for a smaller pixel size and thus a higher pixel density than conventional pixels, which necessitate a guard ring to avoid charge leakage into surrounding pixels. In some embodiments the CDTI filling may comprise polysilicon.

It should be appreciated that the relative dimensions shown in the Figure may not necessarily be to scale.

Some embodiments may be used with BSI (backside illumination) type structures. This means that the photons impinge on the surface which is opposite the electrodes.

In some embodiments, a metal layer may be provided on the resulting semiconductor, opposite to the surface via which the photons impinge. Accordingly, the photon may be reflected from this metal.

It should be appreciated that other embodiments may be used with front side illumination.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A method of manufacturing a semiconductor device, the method comprising:
    providing a semiconductor region with a first trench and a second trench;
    filling the first trench with a doped material and filling the second trench with a second trench material different than the doped material;
    causing a dopant from the doped material to diffuse from the first trench thereby providing a doped region adjacent the first trench;
    removing the doped material from the first trench and the second trench material from the second trench; and
    filling the first and second trenches with a deep trench isolation material to provide capacitive deep trench isolation.

2. The method of claim 1, wherein the doped region provides a charge storage region in a charge storage cell, the method further comprising forming a photodiode adjacent the charge storage region.

3. The method of claim 1, wherein the doped region has a depth that is at least equal to the depth of the first trench.

4. The method of claim 1, wherein the doped region extends from the first trench to the second trench.

5. The method of claim 1, wherein the second trench material is an undoped material.

6. The method of claim 1, further comprising doping an upper portion of the doped region to form a region of higher dopant concentration in the upper portion of the doped region.

7. The method of claim 1, wherein the doped material comprises doped silicon oxide and the second trench material comprises undoped silicon oxide.

8. The method of claim 1, wherein the doped material comprises doped polysilicon and the second trench material comprises undoped polysilicon.

9. The method of claim 1, wherein causing the dopant to diffuse comprises performing an annealing process.

10. The method of claim 1, wherein the semiconductor region includes a third trench on a side of the first trench opposite to the second trench, the method further comprising filling the third trench with the second trench material, wherein the dopant diffuses from the first trench to provide a first doped region between the first trench and the second trench and a second doped region between the first trench and the third trench, the first doped region providing a charge storage region for a first charge storage cell and the second doped region providing a charge storage region for a second charge storage cell.

11. The method of claim 1, wherein the semiconductor region includes a third trench on a side of the second trench opposite to the first trench, the method further comprising filling the third trench with the doped material, wherein the dopant diffuses from the first trench and the third trench to thereby provide a first doped region between the first trench and the second trench and a second doped region between the second trench and the third trench, the first doped region providing a charge storage region for a first charge storage cell and the second doped region providing a charge storage region for a second charge storage cell.

12. The method of claim 1, wherein diffusion of the dopant causes a further doped region to be provided, the further doped region providing a PN junction.

13. The method of claim 1, wherein the first trench at least partially surrounds the second trench or the second trench at least partially surrounds the first trench.

14. A method of making a semiconductor device, the method comprising:
    forming first, second and third trenches in a semiconductor body, the first trench located between the second trench and the third trench;
    filling the first trench with a doped material;
    diffusing dopants from the first trench to form a first doped region between the first trench and the second trench and a second doped region between the first trench and the third trench;
    removing the doped material from the first trench;
    filling the first, second and third trenches with an isolation material: and
    doping an upper portion of the first doped region and an upper portion of the second doped region.

15. The method of claim 14, further comprising forming a first photodiode adjacent the first doped region and a second photodiode adjacent the second doped region, the first photodiode and the first doped region forming a first pixel of an image sensor and the second photodiode and the second doped region forming a second pixel of the image sensor.

16. The method of claim 15, wherein the second and third trenches are filled with an undoped material prior to diffusing dopants from the first trench, the first and second photodiodes being formed subsequent to diffusing dopants from the first trench.

17. The method of claim 15, further comprising:
    filling the second and third trenches with a doped material; and
    diffusing dopants from the second and third trenches to form the first and second photodiodes.

18. The method of claim 14, further comprising doping an upper portion of the first doped region and an upper portion of the second doped region.

19. The method of claim 14, wherein the doped material comprises doped silicon oxide or doped polysilicon, the method further comprising filling the second and third trenches with undoped silicon oxide or undoped polysilicon prior to diffusing the dopants.

20. A method of making a semiconductor device, the method comprising:
    forming a first trench and forming a second trench in a semiconductor body;

filling the first trench with a doped material;

diffusing dopants from the first trench to form a first doped region between the first trench and the second trench;

removing the doped material from the first trench; and filling the first and second trenches with an isolation material, wherein the first doped region forms part of a pixel of an image sensor.

21. The method of claim 20, further comprising filling the first trench with undoped material.

22. The method of claim 20, wherein the first doped region is formed on all four sides of the first trench.

23. The method of claim 20, further comprising forming a first photodiode adjacent the first doped region, the first photodiode and the first doped region forming the pixel of the image sensor.

24. The method of claim 20, further comprising:

forming a third trench disposed parallel to the first trench;

filling the third trench with the doped material;

diffusing dopants from the third trench to form a second doped region between the third trench and the second trench;

removing the doped material from the third trench; and filling the third trench with the isolation material.

25. The method of claim 24, further comprising forming a first photodiode adjacent the first doped region and a second photodiode adjacent the second doped region, the first photodiode and the first doped region forming a first pixel of an image sensor and the second photodiode and the second doped region forming a second pixel of the image sensor.

26. The method of claim 20, further comprising forming a third trench, wherein the third trench is separated from the second trench by a gap, wherein the second trench along with the third trench is disposed along all four sides of the first trench.

27. A method of making a semiconductor device, the method comprising:

forming first, second and third trenches in a semiconductor body, the first trench located between the second trench and the third trench;

filling the first trench with a doped material;

diffusing dopants from the first trench to form a first doped region between the first trench and the second trench and a second doped region between the first trench and the third trench;

removing the doped material from the first trench; and filling the first, second and third trenches with an isolation material, wherein the first doped region forms part of a first pixel of an image sensor, wherein the second doped region forms part of a second pixel of the image sensor.

28. The method of claim 27, further comprising forming a first photodiode adjacent the first doped region and a second photodiode adjacent the second doped region, the first photodiode and the first doped region forming the first pixel of an image sensor and the second photodiode and the second doped region forming the second pixel of the image sensor.

29. The method of claim 28, wherein the second and third trenches are filled with an undoped material prior to diffusing dopants from the first trench, the first and second photodiodes being formed subsequent to diffusing dopants from the first trench.

30. The method of claim 28, further comprising:

filling the second and third trenches with a doped material; and diffusing dopants from the second and third trenches to form the first and second photodiodes.

\* \* \* \* \*